United States Patent
Choi et al.

(10) Patent No.: US 9,018,053 B2
(45) Date of Patent: Apr. 28, 2015

(54) TFT ARRAY SUBSTRATE AND THE FABRICATION METHOD THEREOF FOR PREVENTING CORROSION OF A PAD

(75) Inventors: Young Seok Choi, Gumi-si (KR); Hong Woo Yu, Gumi-si (KR); Ki Sul Cho, Gumi-si (KR); Jae Ow Lee, Ahndong-si (KR); Bo Kyoung Jung, Jeonju-si (KR)

(73) Assignee: LG Display Co., Ltd., Seoul (KR)

(*) Notice: Subject to any disclaimer, the term of this patent is extended or adjusted under 35 U.S.C. 154(b) by 782 days.

(21) Appl. No.: 12/870,395

(22) Filed: Aug. 27, 2010

(65) Prior Publication Data

US 2010/0323482 A1    Dec. 23, 2010

Related U.S. Application Data

(62) Division of application No. 11/289,506, filed on Nov. 30, 2005, now Pat. No. 7,804,089.

(30) Foreign Application Priority Data

Dec. 30, 2004    (KR) ................ 117241/2004

(51) Int. Cl.
*H01L 21/00* (2006.01)
*G02F 1/1345* (2006.01)
(Continued)

(52) U.S. Cl.
CPC .......... *G02F 1/13458* (2013.01); *H01L 27/124* (2013.01); *H01L 27/1288* (2013.01); *H01L 27/1255* (2013.01); *H01L 27/1214* (2013.01); *G02F 2001/136236* (2013.01)

(58) Field of Classification Search
CPC ................................. H01L 27/1214

USPC .................................. 438/158, 159
See application file for complete search history.

(56) References Cited

U.S. PATENT DOCUMENTS 6,188,452 B1 *   2/2001   Kim et al. .................. 349/43
6,423,973 B2 *   7/2002   Choo et al. ............. 250/370.09
(Continued)

FOREIGN PATENT DOCUMENTS

JP    2000-002892          1/2000
KR    10-2002-0012795 A    2/2002
(Continued)

OTHER PUBLICATIONS

Official translation of the reference supplied in Applicant IDS—KR-10-2002-0012795.*
(Continued)

*Primary Examiner* — Kimberly Rizkallah
*Assistant Examiner* — Alexander Belousov
(74) *Attorney, Agent, or Firm* — McKenna Long & Aldridge LLP (57) ABSTRACT

A TFT array substrate is provided. The TFT array substrate includes: a gate electrode connected to a gate line; a source electrode connected to a data line that crosses the gate line and defines a pixel region; a drain electrode facing the source electrode with a channel between; a semiconductor layer forming the channel in between the source electrode and the drain electrode; a pixel electrode in the pixel region and contacting the drain electrode; a channel passivation layer formed on the semiconductor layer; a gate pad with a gate pad lower electrode that extends from the gate line; and a data pad having a data pad lower electrode separated from the data line.

16 Claims, 10 Drawing Sheets

(51) Int. Cl.
  *H01L 27/12* (2006.01)
  *G02F 1/1362* (2006.01)

(56) References Cited

U.S. PATENT DOCUMENTS

| | | | |
|---|---|---|---|
| 2001/0010370 A1* | 8/2001 | Kimura et al. | 257/59 |
| 2003/0134517 A1* | 7/2003 | Segawa et al. | 438/710 |
| 2003/0136971 A1 | 7/2003 | Rhee et al. | |
| 2003/0197814 A1* | 10/2003 | Choi | 349/40 |
| 2004/0135520 A1 | 7/2004 | Park et al. | |
| 2004/0145306 A1 | 7/2004 | Park et al. | |

FOREIGN PATENT DOCUMENTS

| | | |
|---|---|---|
| KR | 10-2004-0050236 | 6/2004 |
| KR | 10-2004-0064466 A | 7/2004 |

OTHER PUBLICATIONS

Machine translation of the reference supplied in Applicant IDS—KR-10-2004-0064466.*

* cited by examiner

TFT ARRAY SUBSTRATE AND THE FABRICATION METHOD THEREOF FOR PREVENTING CORROSION OF A PAD

This application is a divisional of U.S. patent application Ser. No. 11/289,506, filed Nov. 30, 2005 now U.S. Pat. No. 7,804,089, which claims the benefit of Korean Patent Application No. 117241/2994, filed on Dec. 30, 2004, which is hereby incorporated by reference for all purposes as if fully set forth herein.

BACKGROUND OF THE INVENTION

1. Field of the Invention

The present invention relates to a thin film transistor (TFT) array substrate, and more particularly, to a TFT array substrate and a fabrication method thereof capable of protecting TFTs without a passivation layer and preventing galvanic corrosion of a pad.

2. Description of the Related Art

A liquid crystal display device (LCD) displays an image by controlling the light transmittance of liquid crystal (LC) using an electric field.

The LCD drives liquid crystal using an electric field formed between a pixel electrode and a common electrode respectively disposed on an upper substrate and a lower substrate facing each other.

The LCD has a TFT array substrate (lower array substrate) and a color filter array substrate (upper array substrate) facing each other, a spacer disposed between the two array substrates to maintain a cell gap, and liquid crystal filling the cell gap.

The TFT array substrate includes signal lines, TFTs, and an alignment layer coated thereon to align the LC.

The color filter array substrate includes a color filter for reproducing colors, a black matrix (BM) for preventing light leakage, and an alignment layer coated thereon for aligning the LC.

In the LCD, as the TFT array substrate requires a semiconductor process and a plurality of mask processes, the manufacturing process thereof is complicated and thus the manufacturing cost increases.

To solve this problem, it is desired to develop a TFT array substrate that reduces the number of mask processes.

The reason for this is that one mask process may include many processes such as a thin film deposition process, a cleaning process, a photolithography process, an etching process, a photoresist stripping process, and an inspection process.

Recently, a 4-mask process requiring one less mask process than a standard 5-mask process that was typical for a TFT array substrate has been developed.

Figure 1:
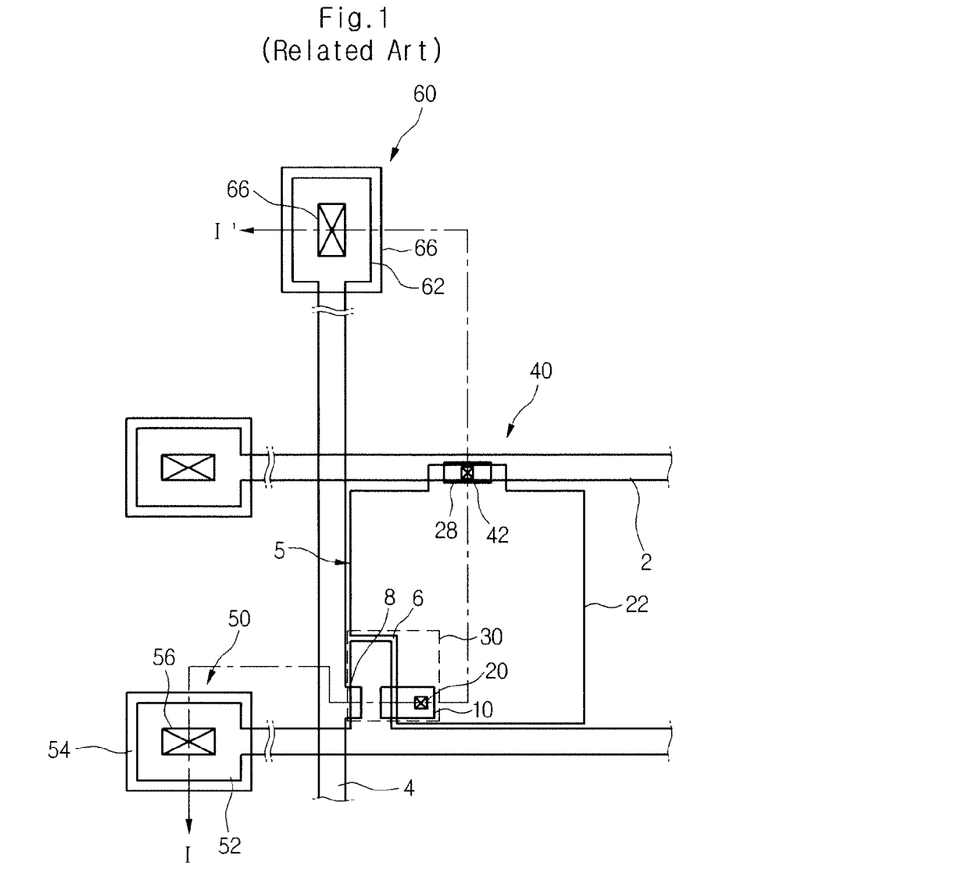
FIG. 1 is a plan view of a TFT array substrate using a 4-mask process of the related art.
Figure 2:
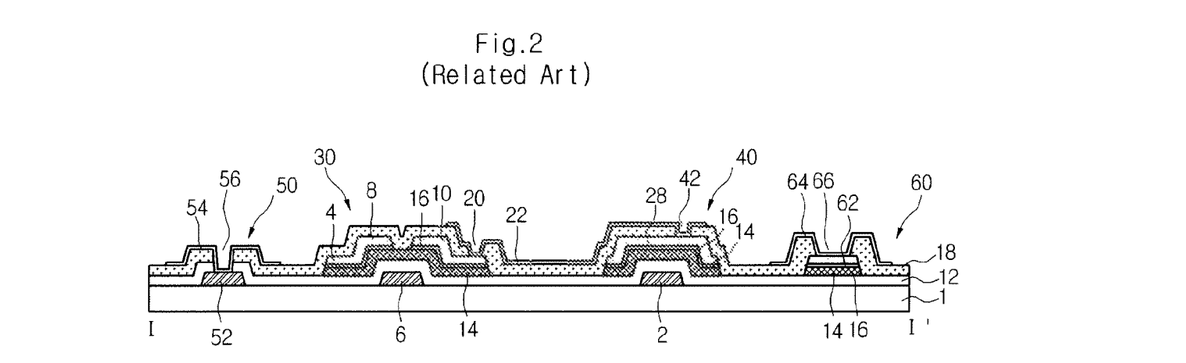
FIG. 2 is a sectional view of the TFT array substrate taken along line I-I' of FIG. 1.

FIG. 1 is a plan view of a related art TFT array substrate fabricated using a 4-mask process, and FIG. 2 is a sectional view taken along line I-I' in FIG. 1.

Referring to FIGS. 1 and 2, the related art TFT array substrate of a liquid crystal panel includes a lower substrate 1, a gate line 2, and a data line 4 formed on the lower substrate crossing each other with a gate insulating layer 12 in between, a TFT 30 formed at each crossing, a pixel electrode 22 formed in a pixel region defined by the crossing gate and data lines, a storage capacitor 40 formed at an overlapping area of the gate line 2 and a storage electrode 28, a gate pad 50 connected to the gate line 2, and a data pad 60 connected to the data line 4.

The gate line 2 supplying a gate signal and the data line 4 supplying a data signal are formed in a crossing structure to define a pixel region 5.

The TFT 30 allows a pixel signal on the data line 4 to be charged and maintained at the pixel electrode 22 in response to the gate signal of the gate line. The TFT 30 includes a gate electrode 6 connected to the gate line 2, a source electrode 8 connected to the data line 4, and a drain electrode 10 connected to the pixel electrode 22.

The TFT 30 further includes an active layer 14 that overlaps the gate electrode 6 with the gate insulating layer 12 between, to form a channel in between the source electrode 8 and the drain electrode 10.

The active layer 14 overlaps the data line 4, a data pad lower electrode 62, and the storage electrode 28.

An ohmic contact layer is further formed on the active layer 14 that provides 16 an ohmic contact with the data line 4, the source electrode 8, the drain electrode 10, the data pad lower electrode 62, and the storage electrode 28.

The pixel electrode 22 is formed in the pixel region 5 and connected to the drain electrode 10 of the TFT 30 through a first contact hole 20 that penetrates a passivation layer 18.

An electric field is formed between the pixel electrode 22 to which a pixel signal is applied through the TFT 30 and a common electrode (not shown) to which a reference voltage is applied. Liquid crystal molecules between the lower array substrate and an upper array substrate are rotated due to dielectric anisotropy by the electric field.

The light transmittance of the pixel region 5 is changed according to the rotational degree of the liquid crystal molecules, so that a gray scale is realized.

The storage capacitor 40 includes the gate line 2 and a storage electrode 28 that overlaps the gate line 2 with the gate insulating layer 12, the active layer 14, and the ohmic contact layer 16 in between.

The storage electrode 28 is connected to the pixel electrode 22 through a second contact hole 42 formed in the passivation layer 18.

The storage capacitor 40 allows a pixel signal charged on the pixel electrode 22 to be stably maintained until a next pixel signal is charged.

The gate pad 50 is connected to a gate driver (not shown) to apply a gate signal to the gate line 2. The gate pad 50 includes a gate pad lower electrode 52 extending from the gate line 2 and a gate pad upper electrode 54 connected to the gate pad lower electrode 52 through a third contact hole 56 that penetrates the gate insulating layer 12 and the passivation layer 18.

The data pad 60 is connected to a data driver (not shown) to apply a data signal to the data line 4. The data pad 60 includes a data pad lower electrode 62 extending from the data line 4 and a data pad upper electrode 64 connected to the data pad lower electrode 62 through a fourth contact hole 66 that penetrates the passivation layer 18.

A method of fabricating a TFT array substrate of a liquid crystal panel using a 4-mask process will be described in detail with reference to FIGS. 3A to 3D.

Figure 3A:
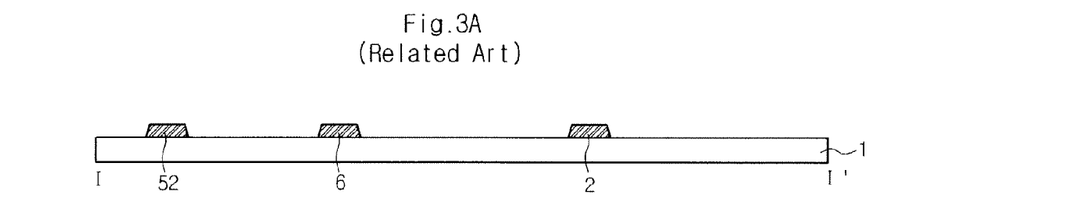
FIG. 3A to 3D illustrate the processes of a method of fabricating a TFT array substrate of a liquid crystal panel in the related art.

Referring to FIG. 3A, a first conductive pattern group including a gate line 2, a gate electrode 6, and a gate pad lower electrode 52 is formed on a lower substrate 1 using a first mask process.

A gate metal layer is formed on the lower substrate 1 using a deposition method (e.g., a sputtering method).

Then, the gate metal layer is patterned by a photolithography process and an etching process that use a first mask, so that the first conductive pattern group including the gate line 2, the gate electrode 6, and the gate pad lower electrode 52 is formed.

Figure 3B:
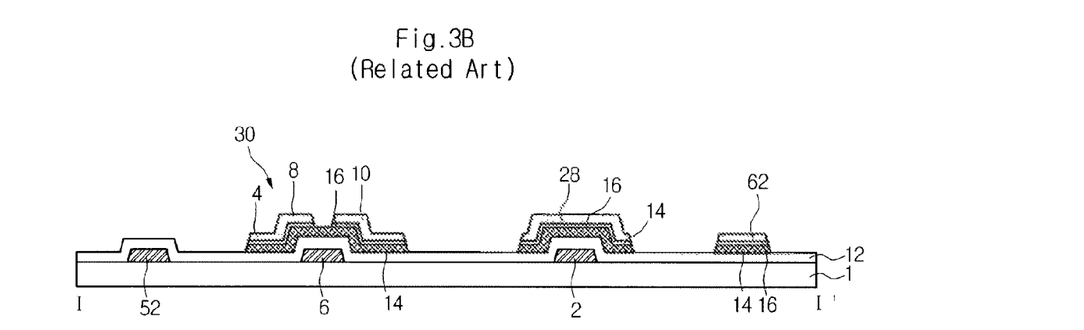

Referring to FIG. 3B, a gate insulating layer 12 is coated on the lower substrate 1 on which the gate pattern is formed.

Thereafter, a semiconductor pattern including an active layer 14 and an ohmic contact layer 16; and a second conductive pattern group including, a data line 4, a source electrode 8, a drain electrode 10, and a data pad lower electrode 62, and a storage electrode 28 are formed on the gate insulating layer 12 using a second mask process.

Figure 3C:
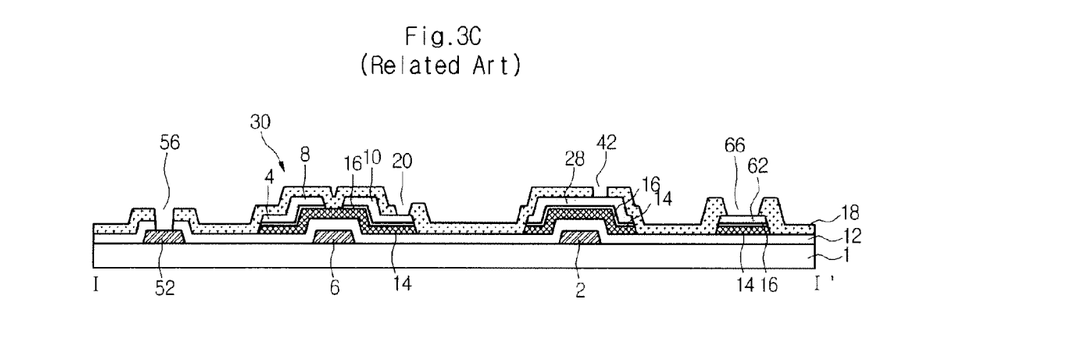

Referring to FIG. 3C, a passivation layer 18 including first to fourth contact holes 20, 42, 56 and 66 is formed by a second mask process on the gate insulating layer 12 on which the second conductive pattern group is formed. The passivation layer 18 is formed by a deposition method (e.g., a plasma enhanced chemical vapor deposition (PECVD)) on the entire surface of the gate insulating layer 12 on which the data pattern is formed.

Thereafter, the passivation layer 18 is patterned through a photolithography process and an etching process that use a third mask, so that the first to fourth contact holes 20, 42, 56, and 66 are formed.

The first contact hole 20 penetrates the passivation layer 18 to expose the drain electrode 10, and the second contact hole 42 penetrates the passivation layer 18 to expose the storage electrode 28.

The third contact hole 56 penetrates the passivation layer 18 and the gate insulating layer 12 to expose the gate pad lower electrode 52, and the fourth contact hole 66 penetrates the passivation layer 18 to expose the data pad lower electrode 62.

Figure 3D:
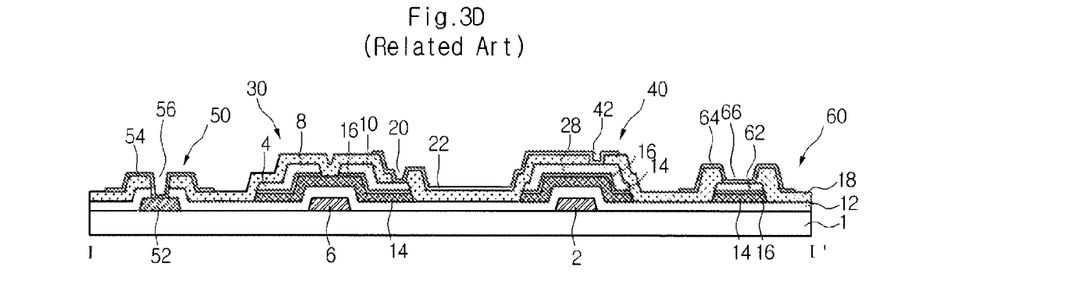

Referring to FIG. 3D, a third conductive pattern group including a pixel electrode 22, a gate pad upper electrode 54, and a data pad upper electrode 64 is formed on the passivation layer 18 using a fourth mask process.

The related art TFT array substrate has the passivation layer 18 to protect the TFT 30.

The passivation layer 18 is formed by depositing inorganic insulation material using a PECVD apparatus, or coating an organic insulation material using a spin coating apparatus or a spinless coating apparatus.

Because the PECVD apparatus, the spin coating apparatus, or the spinless coating apparatus are required to form the passivation layer 18 as descried above, the manufacturing cost increases.

Also, because the data line 4 is formed using a single layer, it is frequently opened. In this case, a separate process is required to repair the opened data line 4.

Also, when the passivation layer 18 is formed of an organic insulation material, the pixel electrode 22 may be disconnected due to the relatively thick passivation layer 18.

Particularly, the pixel electrode 22 is disconnected at the side of the passivation layer 18 exposed by the contact hole 20 for allowing the drain electrode 10 to contact with the pixel electrode 22.

Accordingly, because a pixel signal is not applied to the pixel electrode 22 through the drain electrode 10, a point defect is generated.

Also, the storage capacitor 40 includes the gate line 2 and the storage electrode 28 that overlap each other with the gate insulating layer 12, the active layer 14, and the ohmic contact layer 16 in between.

In this case, the capacitance of the storage capacitor 40 is degraded by the relatively thick gate insulating layer 12 that insulates the gate line 2 from the storage electrode 28, the active layer 14, and the ohmic contact layer 16.

Also, image quality degradation (e.g., spots) results due to the relatively low capacitance of the storage capacitor 40.

Also, because the data pad is opened when the passivation layer is formed, a defect (e.g., galvanic corrosion of a data pad) may be generated during a subsequent process.

SUMMARY OF THE INVENTION

Accordingly, the present invention is directed to a TFT array substrate and a fabrication method thereof that substantially obviate one or more problems due to limitations and disadvantages of the related art.

An advantage of the present invention is to provide a TFT array substrate and a fabrication method thereof capable of protecting TFTs without a passivation layer and reducing manufacturing costs.

Another advantage of the present invention is to provide a TFT array substrate and a fabrication method thereof capable of preventing galvanic corrosion due to the opening of a data pad by forming the data pad using a jumping structure from a gate metal pattern and a data metal pattern.

A further another advantage of the present invention is to provide a TFT forming an static electricity prevention structure by separating even/odd data lines from a TFT array substrate.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these objects and other advantages and in accordance with the purpose of the invention, as embodied and broadly described herein, there is provided a TFT array substrate including: a gate electrode connected to a gate line; a source electrode connected to a data line that crosses the gate line and defines a pixel region; a drain electrode facing the source electrode with a channel between; a semiconductor layer forming the channel in between the source electrode and the drain electrode; a pixel electrode in the pixel region and contacting the drain electrode; a channel passivation layer formed on the semiconductor layer; a gate pad with a gate pad lower electrode that extends from the gate line; and a data pad having a data pad lower electrode separated from the data line.

In the second aspect of the present invention, there is provided a method of fabricating a TFT array substrate including: forming a gate electrode, a gate line, a gate pad, and a data pad on a substrate; forming a gate insulating layer on the gate electrode; forming a data line that crosses the gate line, a source electrode and a drain electrode, a semiconductor layer forming a channel between the source electrode and the drain electrode on the gate insulating layer, and forming a channel passivation layer on the semiconductor layer so as to protect the channel of the semiconductor layer; and forming a pixel electrode contacting the drain electrode and a jumping electrode connecting the data line with the data pad on the drain electrode and the gate insulating layer.

In the third aspect of the present invention, there is provided a method of fabricating a TFT array substrate including: forming a first conductive pattern group that includes a gate line, a gate electrode connected to the gate line, a gate pad lower electrode extending from the gate line, and a data pad lower electrode on a substrate; forming a gate insulating layer to cover the first conductive pattern group; forming a second conductive pattern group that includes a data line that intersects the gate line, a source electrode protruding from the data line, a drain electrode that faces the source electrode with a channel in between and a semiconductor group that forms the channel on the gate insulating layer, and forming a channel passivation layer on the channel of the semiconductor group; forming contact holes passing through the gate insulating layer to expose the gate pad lower electrode and a portion of the data pad lower electrode; and forming a third conductive pattern group that includes a pixel electrode contacting the drain electrode, a data pad upper electrode connected to the data pad lower electrode through a contact hole, a gate pad upper electrode connected to the gate pad lower electrode through a contact hole, and a jumping electrode connecting the data pad lower electrode with the data line through a contact hole.

In the fourth aspect of the present invention, there is provided a TFT array substrate including: a gate electrode connected to a gate line; a source electrode connected to a data line that crosses the gate line and defines a pixel region; a drain electrode facing the source electrode with a channel in between; a semiconductor layer forming the channel between the source electrode and the drain electrode; a pixel electrode disposed in the pixel region and contacting the drain electrode; a channel passivation layer formed on the semiconductor layer; a gate pad having a gate pad lower electrode that extends from the gate line; a data pad having a data pad lower electrode separated from the data line; even and odd data lines that apply a signal to the data pad; and a static electricity prevention line pattern connected to one of the even and odd data lines and spaced at a predetermined interval.

In the fifth aspect of the present invention, there is provided a method of fabricating a TFT array substrate including: forming a gate electrode, a gate line, a gate pad, a data pad, and a first shorting bar on a substrate; forming a gate insulating layer on the substrate; forming a semiconductor layer and a metal layer on the gate insulating layer; patterning the semiconductor layer and the metal layer to form the gate line, a data line, a TFT region, the gate pad, the data pad, and a second shorting bar; forming a channel passivation layer on the channel of the semiconductor group; forming contact holes that pass through the gate insulating layer to expose a gate pad lower electrode and a portion of a data pad lower electrode; and coating a transparent conductive layer on the substrate and pattering the same to form a source electrode, a drain electrode, and the semiconductor layer forming a channel between the source electrode and the drain electrode, a pixel electrode that contacts the drain electrode in the TFT region, upper electrodes of the gate pad and the data pad, and a jumping electrode that connects the data line with the data pad.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE ILLUSTRATED EMBODIMENT

Reference will now be made in detail to the preferred embodiments of the present invention, examples of which are illustrated in the accompanying drawings.

Figure 4:
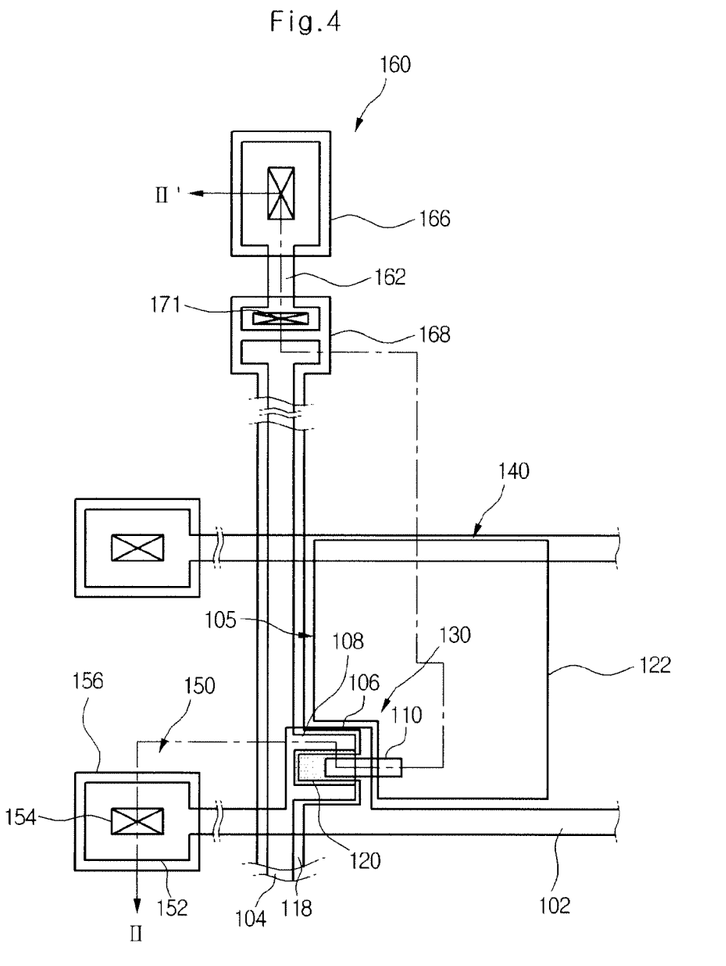
FIG. 4 is a plan view of a TFT array substrate according to the present invention.
Figure 5:
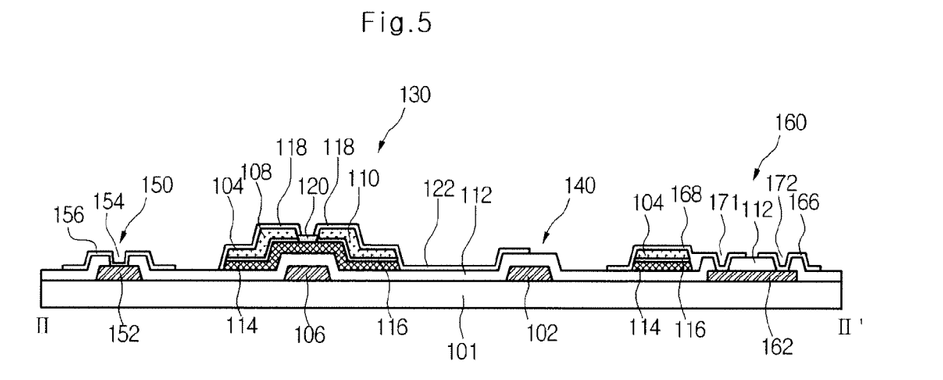
FIG. 5 is a sectional view of the TFT array substrate taken along line II-II' of FIG. 4.

FIG. 4 is a plan view of a TFT array substrate according to the present invention, and FIG. 5 is a sectional view of the TFT array substrate taken along line II-IF of FIG. 4.

Referring to FIGS. 4 and 5, the TFT array substrate includes a gate insulating layer 112 on a lower substrate 101, a TFT 130 formed at each crossing, a pixel electrode 122 formed in a pixel region defined by the crossing structure, and a channel passivation layer 120 for protecting the TFT 130.

Also, the TFT array substrate further includes a storage capacitor 140 formed where the gate line 102 overlaps the pixel electrode 122, a gate pad 150 connected to the gate line 102, and a data pad 160 connected to the data line 104 by a jumping structure.

The gate line 102 that applies a gate signal and the data line 104 that applies data signal are formed at the crossing to define the pixel region 105.

The TFT 130 allows a pixel signal of the data line 104 to be charged and maintained at the pixel electrode 122 in response to a gate signal of the gate line 102.

For this purpose, the TFT 130 has a gate electrode 106 connected to the gate line 102, a source electrode 108 connected to the data line 104, and a drain electrode 110 connected to the pixel electrode 122.

Also, the TFT 130 further has an active layer 114 that overlaps the gate electrode 106 with the gate insulating layer 112 in between and forming a channel between the source electrode 108 and the drain electrode 110. The active layer 114 also overlaps the data line 104 and a data pad lower electrode 162.

An ohmic contact layer 116 providing an ohmic contact with the data line 104, the source electrode 108, the drain electrode 110, and the data pad lower electrode 162 is further formed on the active layer 114.

The channel passivation layer 120 is formed of SiOx or SiNx on the active layer 114 forming the channel between the source electrode 108 and the drain electrode 110.

The channel passivation layer 120 prevents the active layer 114 that forms the channel from being damaged during the stripping process of removing photoresist patterns used when the source electrode 108, the drain electrode 110, and the pixel electrode 122 are formed, and a cleaning process performed before and after all of the processes.

The pixel electrode 122 is connected to the drain electrode 110 of the TFT 130 through a drain contact hole that passes through a passivation layer and formed in the pixel region 105.

A transparent conductive pattern 118 is formed of the same material as the pixel electrode 122 on the source electrode 108, the drain electrode 110, and the data line 104.

The transparent conductive pattern 118 forms a jumping electrode 168 connecting the data line 104 with the data pad 150 in the jumping structure.

The transparent conductive pattern 118 formed on the data line 104 serves as a repair line that supplies a data signal to the source electrode 108 of the TFT 130 when the data line 104 is cut.

The transparent conductive pattern 118 formed on the source electrode 108 and the drain electrode 110 prevents corrosion of the source electrode 108 and the drain electrode 110 formed of metal (e.g., Mo) vulnerable to corrosion. The transparent conductive pattern 118 is so spaced as to prevent short circuit with an adjacent transparent conductive pattern 118 or an adjacent pixel electrode 122.

The transparent conductive pattern 118 formed on the source electrode 108 and the transparent conductive pattern 118 formed on the drain electrode 110 are spaced about 4-5 μm for example, and the transparent conductive pattern 118 formed on the data line 104 and the pixel electrode 122 are also spaced about 4-5 μm.

Accordingly, an electric field is formed between the pixel electrode 122 to which a pixel signal is supplied through the TFT 130 and a common electrode (not shown) to which a reference voltage is supplied.

LC molecules between the lower array substrate and the upper array substrate are rotated due to dielectric anisotropy by the electric field.

Light transmittance of the LC is changed according to the degree of rotation of liquid crystal molecules, so that a gray scale is realized.

The storage capacitor 140 includes the gate line 102 and the pixel electrode 122 that overlaps the gate line 102 with the gate insulating layer 112 in between.

The storage capacitor 140 allows a pixel signal charged on the pixel electrode 122 to be stably maintained until the next pixel signal is charged.

The gate pad 150 is connected to a gate driver (not shown) to apply a gate signal to the gate line 102. The gate pad 150 includes a gate pad lower electrode 152 extending from the gate line 102 and a gate pad upper electrode 156 connected to the gate pad lower electrode 152 through the third contact hole 154 that passes through the gate insulating layer 112.

Also, the data pad 160 is connected to a data driver (not shown) to apply a data signal to the data line 104. The data pad 160 includes a data pad lower electrode 162 and a data pad upper electrode 166 connected to the data pad lower electrode 162 with the gate insulating layer 112 in between.

The data pad 160 formed of the gate pattern is connected to the data line 104 in a jumping structure with the gate insulating layer 112 in between.

The jumping structure includes the data pad lower electrode 162 and a jumping electrode 168, which is a transparent conductive layer, connecting the data pad lower electrode 162 with the data line 104.

Figure 6A:
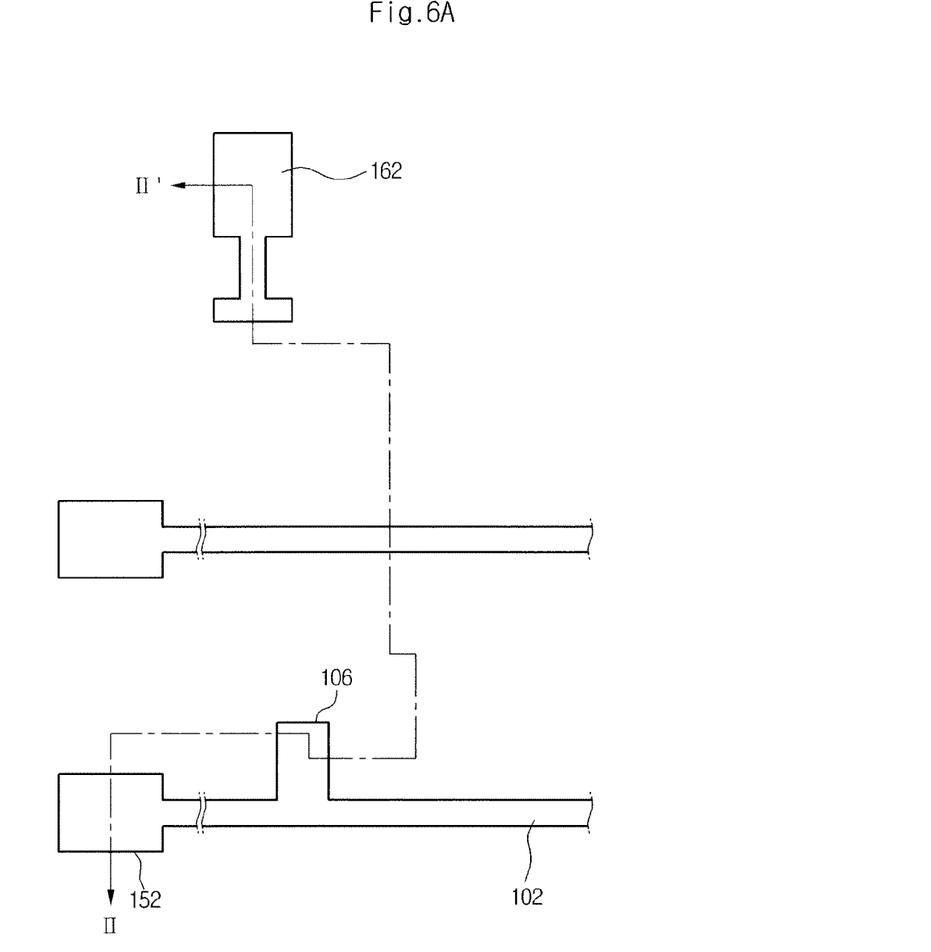
FIGS. 6A and 6B are a plan view and a sectional view illustrating a method of fabricating the first conductive pattern group using the first mask process on a TFT array substrate according to the present invention.
Figure 6B:
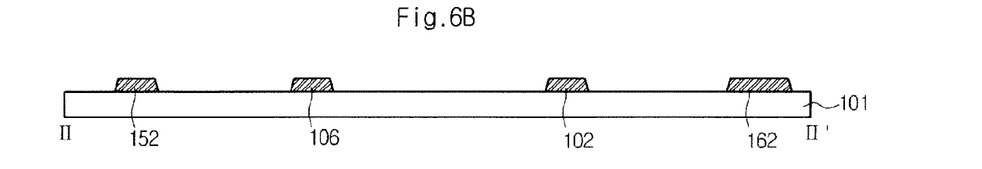

FIGS. 6A and 6B are a plan view and a sectional view illustrating a method of fabricating the first conductive pattern group of a TFT array substrate according to the present invention.

Referring to FIGS. 6A and 6B, a gate pattern that includes the gate line 102, the gate electrode 106, the gate pad lower electrode 152, and the data pad lower electrode 162 is formed on the lower substrate 101 using the first mask process.

First, a gate metal layer is formed on the lower substrate 101 using a deposition method such as a sputtering.

Subsequently, the gate metal layer is patterned through a photolithography process and an etching process that use the first mask, so that the gate pattern that includes the gate line 102, the gate electrode 106, the gate pad lower electrode 152, and the data pad lower electrode 162 is formed.

Here, the gate metal layer may be formed of aluminum or of an aluminum alloy (e.g., Al, Al/Nd).

Figure 7A:
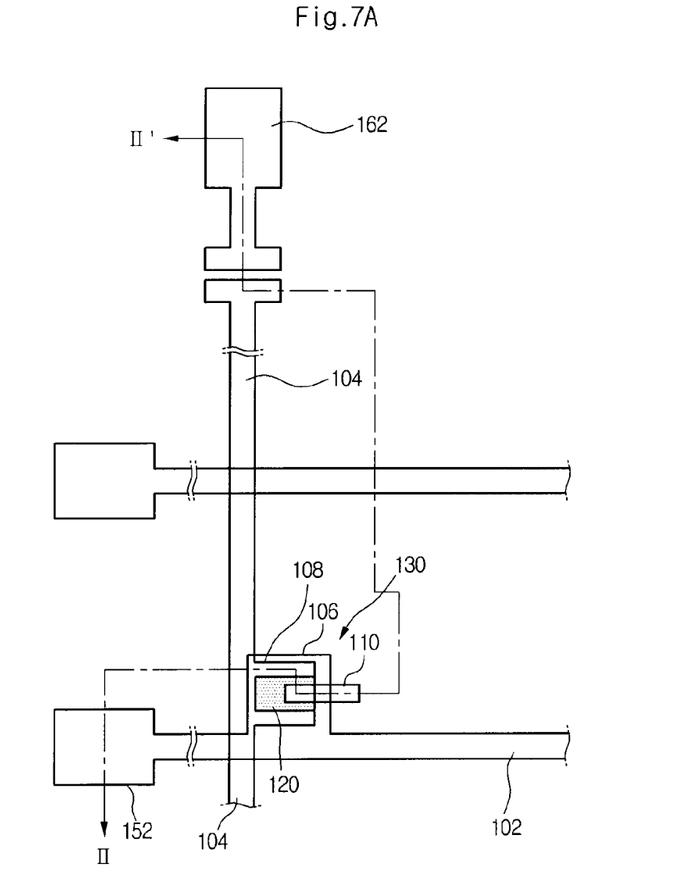
FIGS. 7A and 7B are a plan view and a sectional view illustrating a method of fabricating a semiconductor pattern, the second conductive pattern group, and a channel passivation layer using the second mask process on a TFT array substrate according to the present invention.
Figure 7B:
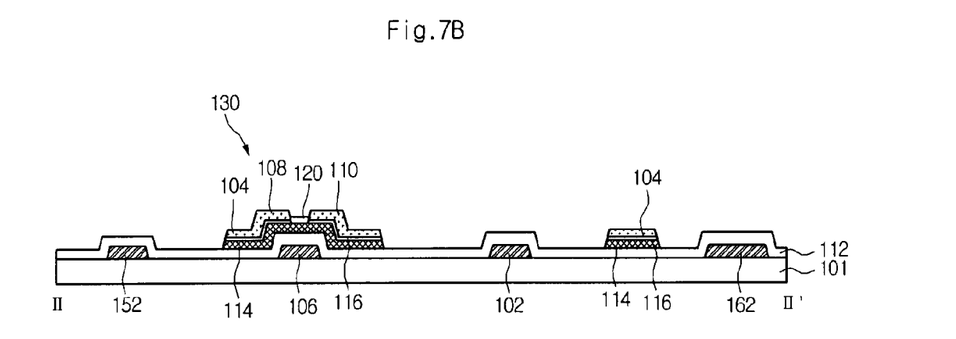

FIGS. 7A and 7B are a plan view and a sectional view illustrating a method of fabricating a semiconductor pattern, the second conductive pattern group, and a channel passivation layer of a TFT array substrate according to the present invention;

Referring to FIGS. 7A and 7B, the gate insulating layer 112 is coated on the lower substrate 101 on which the first conductive pattern grope is formed.

Next, the semiconductor pattern that includes the active layer 114, the ohmic contact layer 116, and the second conductive pattern group that includes the data line 104, the source electrode 108, and the drain electrode 110 are formed on the gate insulating layer 112 using the second mask process. Also, the channel passivation layer 120 is formed on the active layer 114 that forms the channel between the source electrode 108 and the drain electrode 110.

Figure 8A:
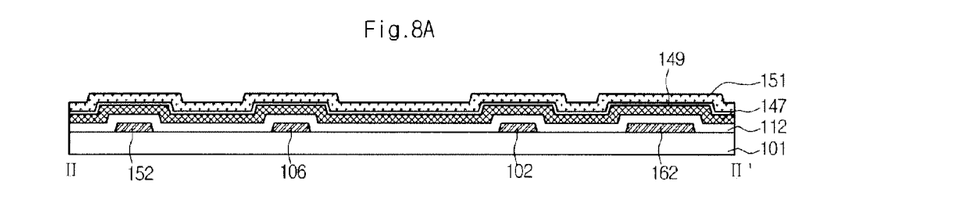
FIGS. 8A to 8F are views illustrating processes of a method of fabricating the second conductive pattern group according to the present invention.

Referring to FIG. 8A, the first semiconductor layer 147, the second semiconductor layer 149, and the source/drain metal layer 151 are sequentially formed on the gate insulating layer 112 using a deposition method such as a sputtering.

The first semiconductor layer 147 may be amorphous silicon not doped with impurities and the second semiconductor 149 may be amorphous silicon doped with N-type impurities or P-type impurities.

Figure 8B:
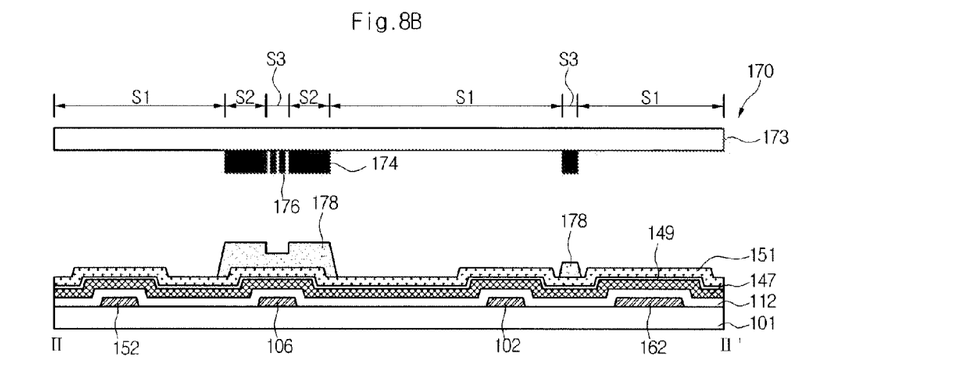

The source/drain electrode metal layer 151 is formed of metal such as Mo and Cu. Next, a photoresist layer is formed on the source/drain metal layer 151 and a partial exposure second mask 170 is aligned on the lower substrate 101 as illustrated in FIG. 8B.

The second mask 170 has a mask substrate 173 made of a transparent material, a blocking portion 174 formed in a blocking region S2 of the mask substrate 173, and a diffraction exposure portion 176 (or transreflective portion) formed in a partial exposure region S3 of the mask substrate 173.

A region where the mask substrate 173 is exposed becomes an exposure region S1.

The photoresist layer using the second mask 170 is light-exposed and then developed, so that a photoresist pattern 178 having the blocking region S2 and a step difference in the partial exposure region S3 that correspond to the blocking portion 174 and the diffraction exposure portion 176 of the second mask 170, respectively, is formed.

That is, the photoresist pattern 178 where the partial exposure region S3 is formed has the second height h2 lower than the first height h1 of the photoresist pattern 178 formed at the blocking region S2.

Figure 8C:
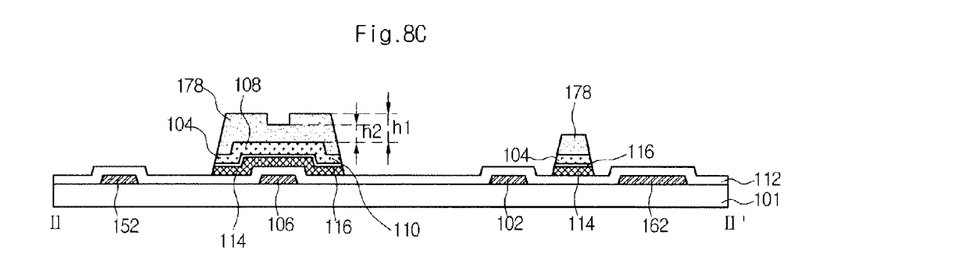

The source/drain metal layer 151 is patterned through a wet etching process that uses the photoresist pattern 178 as a mask, so that the second conductive pattern group that includes the data line 104, the source electrode 108 connected to the data line 104, and the drain electrode 110 is formed as illustrated in FIG. 8C.

Figure 8D:
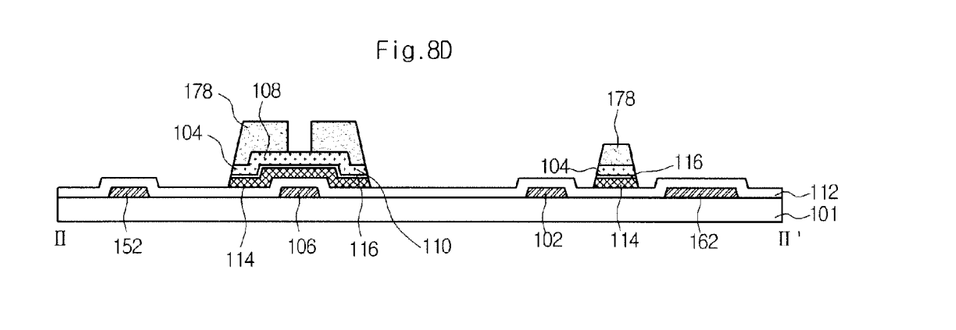

The first semiconductor layer and the second semiconductor layer are patterned through a dry etching process that uses the photoresist pattern 178 as a mask, so that the ohmic contact layer 116 and the active layer 114 are formed along the second conductive pattern group as illustrated in FIG. 8D.

Subsequently, the photoresist pattern having the second height h2 at the partial exposure region S3 is removed through an ashing process that uses O2-plasma, and the photoresist pattern 178 having the first height h1 at the blocking region S2 is lowered in its height.

The diffraction exposure region S3, i.e., the source/drain metal layers and the ohmic contact layer 116 formed in a channel portion of the TFT is removed through an etching process that uses the photoresist pattern 178. Accordingly, the active layer 114 of the channel portion is exposed, so that the source electrode 108 is separated from the drain electrode 110.

Figure 8E:
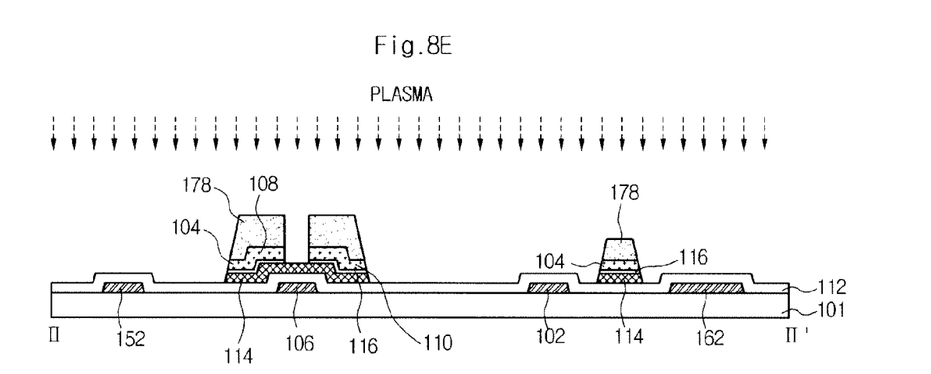

Referring to FIG. 8E, the surface of the exposed active layer 114 of the channel portion is exposed to Ox-plasma (e.g., O2) or Nx-plasma (e.g., N2) using the photoresist pattern 178 for a mask.

Ox or Nx in an ion state reacts with silicon present in the active layer 114, so that a channel passivation layer 120 including one of SiO2 and SiNx is formed on the active layer 114 of the channel portion.

The channel passivation layer 120 prevents the active layer 114 of the channel portion from being damaged by a stripping solution and a cleaning solution used during a stripping process and a cleaning process, respectively, which are subsequent processes.

Figure 8F:
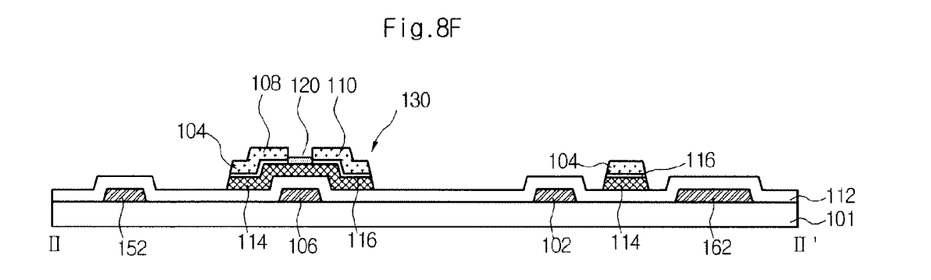

Referring to FIG. 8F, the photoresist pattern 178 remaining on the second conductive pattern group is removed by a stripping process.

The data line 104 may be formed near the data pad lower electrode 162 or overlap the data pad lower electrode 162 so as to connect with the data pad 160 in a jumping structure.

Figure 9A:
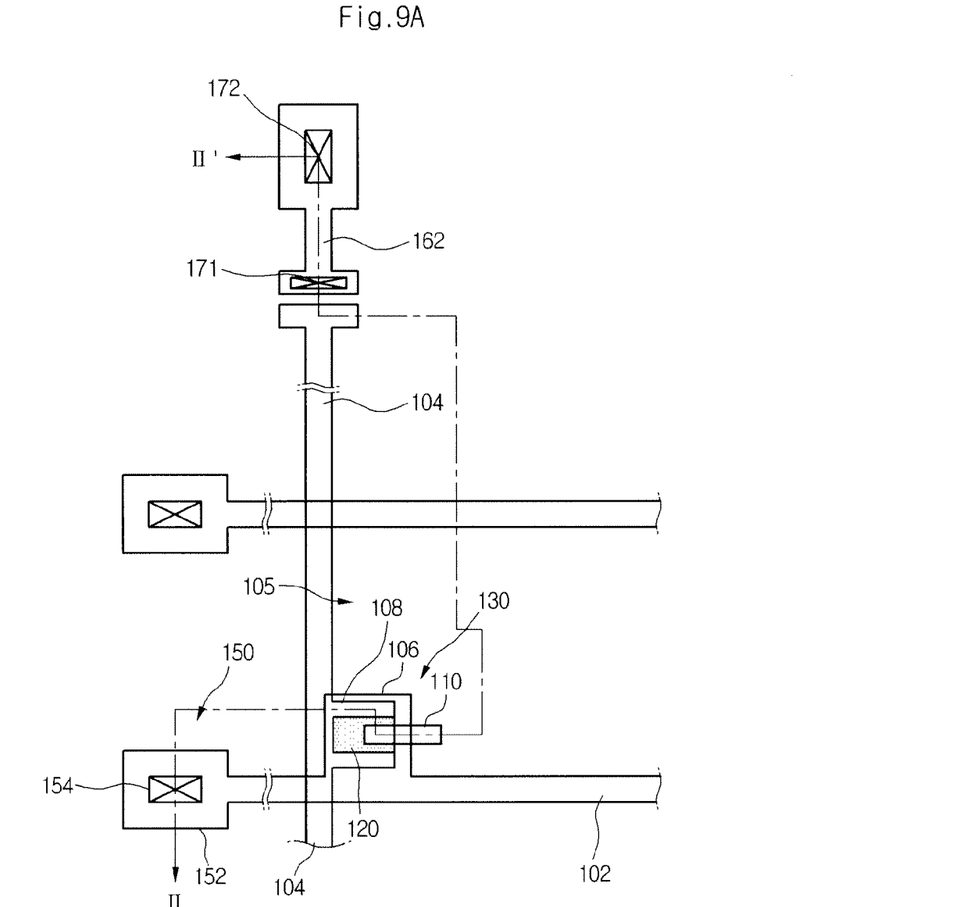
FIGS. 9A and 9B are a plan view and a sectional view illustrating the third mask process in a TFT array substrate according to the present invention.
Figure 9B:
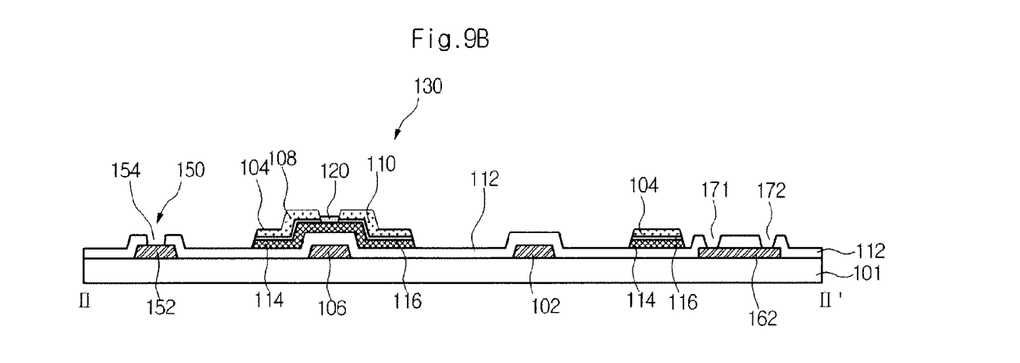

Referring to FIGS. 9A and 9B, the contact hole 154 exposing the gate insulating layer 112 formed to cover the gate pad lower electrode 152, the contact hole 172 for exposing the data pad lower electrode 162, the contact hole 171 for exposing the data lower electrode 162 so as to connect the data pad lower electrode 162 with the data line 104 in the jumping structure, are formed using the third mask process.

The gate insulating layer 112 formed to cover the gate pad lower electrode 152 is patterned through a photolithography process and an etching process that use the third mask, so that the contact hole 154 exposing the gate pad lower electrode 152 is formed.

The data line 104 is connected to the data pad 160 including of the gate pattern in a jumping structure. For this purpose, the contact hole 171 exposing the data pad lower electrode 162 is formed.

Because the data pad lower electrode 162 includes the gate pattern, the contact hole 172 exposing the partial end of the data pad lower electrode 162 is formed to open the data pad.

Figure 10A:
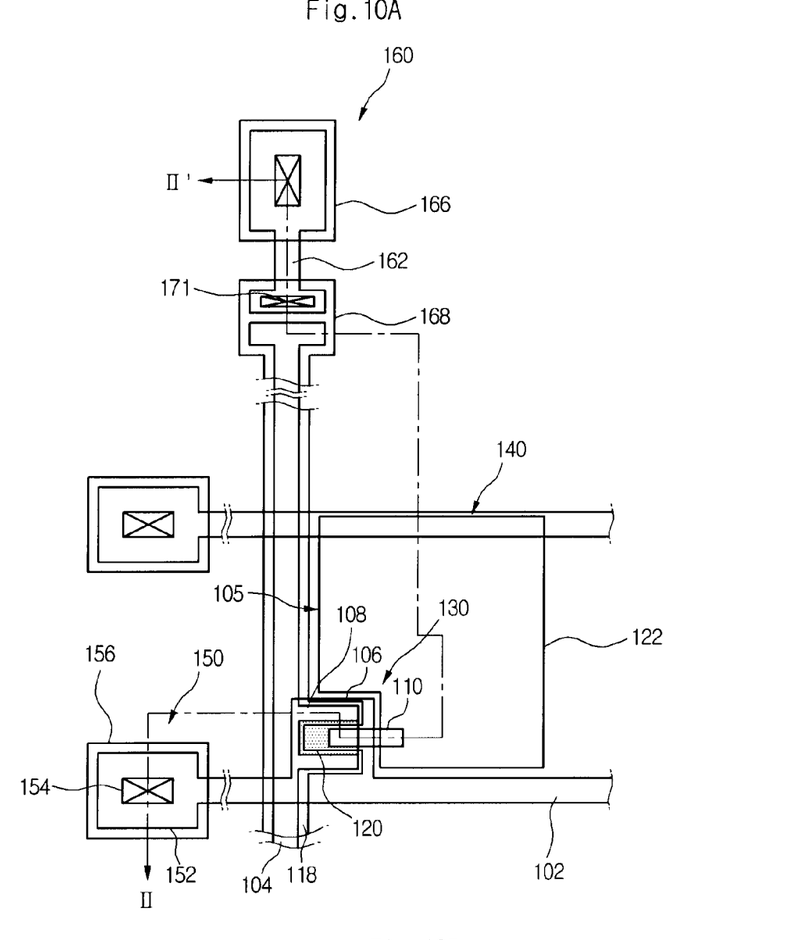
FIGS. 10A and 10B are a plan view and a sectional view illustrating the fourth mask process in a TFT array substrate according to the present invention.
Figure 10B:
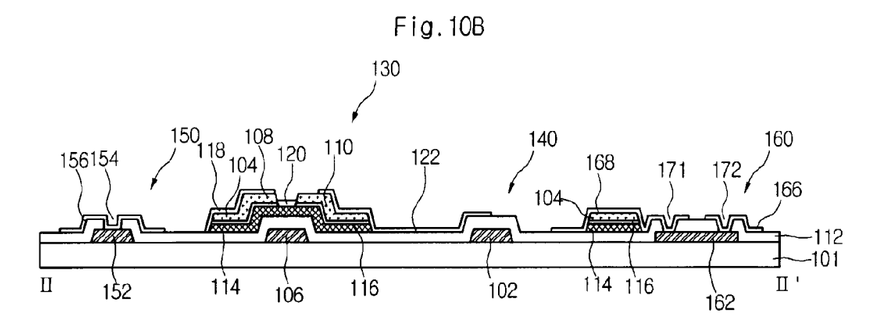

Referring to FIGS. 10A and 10B, the third conductive pattern group that includes the pixel electrode 122, the transparent conductive pattern 118, the gate pad upper electrode 156, the data pad upper electrode 166, and the jumping electrode 168 is formed using the fourth mask process on the lower substrate 101 in which the contact hole 154 is formed.

In detail, the transparent conductive layer is coated using a deposition method (e.g., a sputtering) on the substrate 101 on which the contact hole 154 is formed.

The transparent conductive layer is formed of one selected from the group including indium tin oxide (ITO), tin oxide (TO), indium tin zinc oxide (ITZO), and indium zinc oxide (IZO).

Subsequently, the transparent conductive layer is patterned using a photolithography process and an etching process, so that the third conductive pattern group that includes the pixel electrode 122, the transparent conductive pattern 118, the gate pad upper electrode 156, the data pad upper electrode 166, and the jumping electrode is formed.

The pixel electrode 122 is directly connected to the drain electrode 110.

The transparent conductive pattern 118 is formed on the data line 104, the source electrode 108, and the drain electrode 110 to directly connect with them. The gate pad upper electrode 156 is electrically connected to the gate pad lower electrode 152 through the contact hole 154. The data pad upper electrode 166 is electricity connected to the data pad lower electrode 162 through the contact hole.

Also, in the jumping structure that connects the data line 104 with the data pad 160, the jumping electrode 168 directly connected to the data line 104 is electrically connected to the data pad lower electrode 162 through the contact hole 171.

As described above, the data pad 160 includes the data pad lower electrode 162 including the gate pattern and the data pad upper electrode 166 including the transparent conductive layer, and the data pad lower electrode 162 extends toward the side of the data line 104 and is connected thereto in the jumping structure.

The jumping structure is a structure in which the data line 104 is connected to the data pad lower electrode 162 by the jumping electrode 168. The jumping electrode 168 is connected through the contact hole 171 formed in the data pad lower electrode 162 and can be connected to the transparent conductive pattern formed on the data line 104.

The TFT array substrate is attached to the color filter array substrate facing the TFT array substrate and liquid crystal is disposed therebetween to form a liquid crystal panel.

The color filter array substrate includes color filters formed in the liquid crystal cells, a black matrix for separating the color filters and reflecting external light, and a common electrode supplying a reference voltage to liquid crystal cells in common.

Particularly, the TFT array substrate passes through a signal inspection process to detect line defects such as a short circuit or a cut signal line, or a defect of the TFT after the manufacturing process.

For the signal inspection process, odd shorting bars and even shorting bars connected to the odd lines and the even lines of the gate lines and the data lines, respectively, are formed on the TFT array substrate.

Specifically, a data line inspection detects a line defect using the data odd shorting bar connected to the odd data lines and the data even shorting bar connected to the even data lines.

Figure 11:
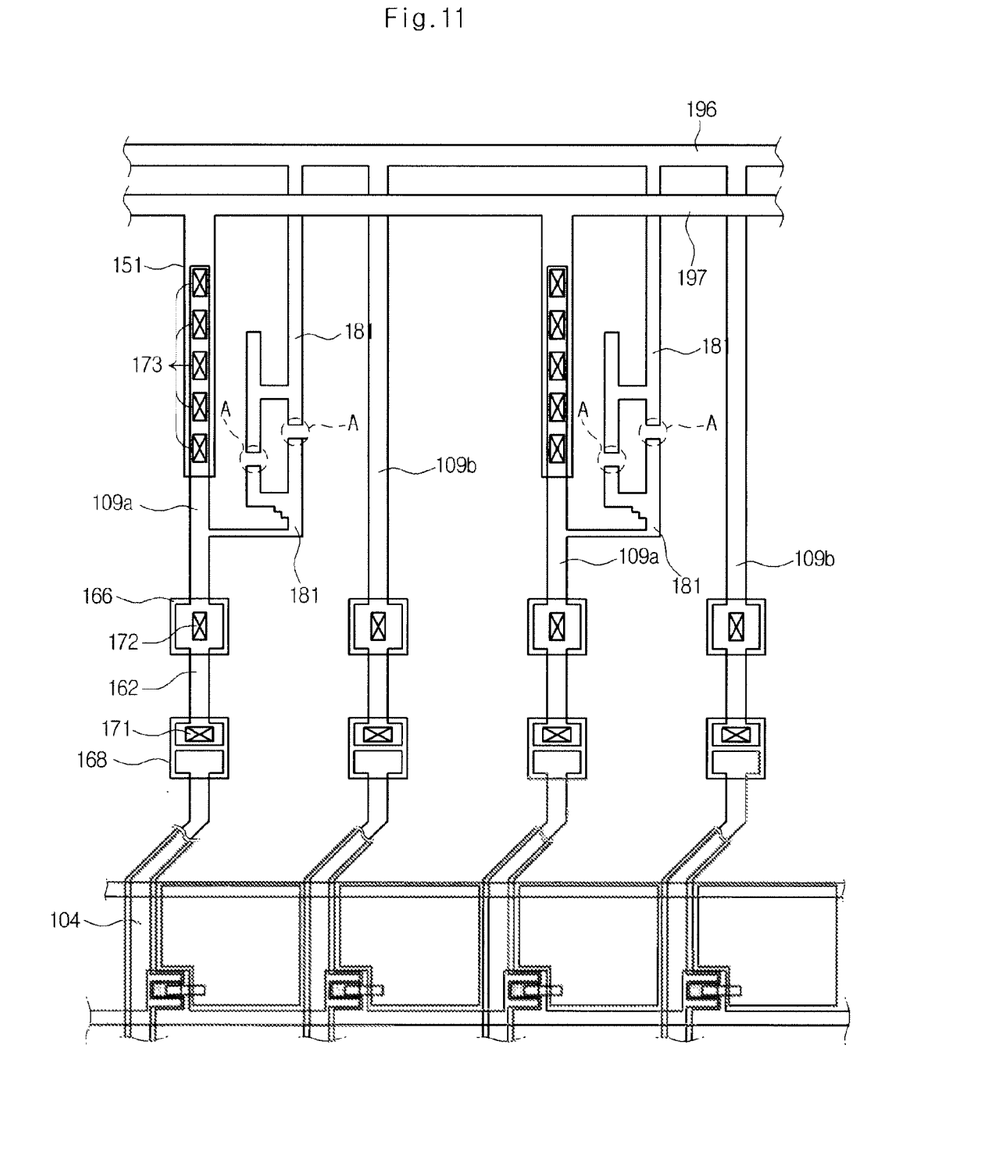
FIG. 11 is a plan view illustrating a partial portion of an outer pad of a TFT array substrate according to the present invention.

FIG. 11 is a plan view illustrating a portion of an outer pad of a TFT array substrate according to the present invention.

Referring to FIG. 11, the TFT array substrate includes a transistor formed at each crossing of a gate line 102 and a data line 104, and the pixel electrode 122 connected to the TFT 130. The data line 104 forms the data pad 160 by way of data link at the edge of the substrate.

The data pad 160 is connected by even/odd data lines 109a/109b and connected to the shorting bars 196 and 197.

The data pad 160 and the even/odd data lines 109a/109b connected to the data line 104 by a jumping structure are formed of gate metal, and the even data lines 109a are connected to a data metal pattern 151 through a contact hole 173 and connected to the data even shorting bar 197.

The odd data lines 109b are connected to the data odd shorting bar 196 formed of gate metal.

To preventing static electricity, discharge the even data lines 109a have an H-shaped ground line 181, which has a cut portion A.

The cut portion A is several μm to allow static electricity to be discharged through the ground line 181 when static electricity is generated.

The ground line 181 is connected to the data odd shorting bar 196.

Therefore, the even/odd data lines 109a and 109b form an equipotential through the ground line 181 to prevent static electricity.

After that, the data even/odd shorting bars 196 and 197 are cut and removed when a liquid crystal panel is formed.

Because the TFT array substrate and the fabrication method thereof according to the present invention do not require separate equipment to form the passivation layer, the manufacturing cost may be reduced and opening of the pixel electrode at the step portion of the contact hole exposing the drain electrode can be prevented.

Also, the TFT array substrate and the fabrication method thereof may supply a pixel signal to each TFT using the transparent conductive pattern without a repair process when an open defect of the data line is present and may prevent corrosion of the data line, the source electrode, and the drain electrode.

Also, in the TFT array substrate and the fabrication method thereof, the distance between two conductors forming the storage capacitor is small, so that capacitance of the capacitor increases and image quality deterioration (e.g., a blot) may be improved.

The TFT array substrate and the fabrication method thereof may prevent galvanic corrosion of the data pad.

Also, the TFT array substrate and the fabrication method thereof form a static electricity prevention structure by separating the even data line and the odd data line, so that the number of processes may be reduced.

It will be apparent to those skilled in the art that various modifications and variations can be made in the present invention. Thus, it is intended that the present invention covers the modifications and variations of this invention provided they come within the scope of the appended claims and their equivalents.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method of fabricating a TFT (thin film transistor) array substrate comprising:
    forming a gate electrode, a gate line, a gate pad, and a data pad on a substrate;
    forming a gate insulating layer on the gate electrode;
    forming a data line that crosses the gate line, a source electrode and a drain electrode, a semiconductor layer forming a channel between the source electrode and the drain electrode on the gate insulating layer, and forming a channel passivation layer on the semiconductor layer so as to protect the channel of the semiconductor layer; and
    forming a pixel electrode on the drain electrode and the gate insulating layer and a jumping electrode connecting the data line with the data pad,
    wherein the forming of the data line that crosses the gate line, the source electrode and the drain electrode, the semiconductor layer forming the channel between the source electrode and the drain electrode on the gate insulating layer, and the forming of the channel passivation layer on the semiconductor layer so as to protect the channel of the semiconductor layer, includes:
    sequentially forming a first semiconductor layer, a second semiconductor layer, and a data metal layer on the gate insulating layer;
    forming a step photoresist pattern on the data metal layer using a partial exposure mask;
    patterning the first and second semiconductor layers, and the data metal layer using the photoresist pattern to form an active layer, an ohmic contact layer, the data line, the source electrode, and the drain electrode;
    ashing the photoresist pattern;
    patterning the metal layer and the ohmic contact layer that correspond to the channel using the ashed photoresist pattern to expose the active layer forming the channel;
    exposing the exposed surface of the active layer to plasma using the ashed photoresist pattern as a mask to form the channel passivation layer on the exposed active layer; and
    removing the ashed photoresist pattern, and
    wherein the channel passivation layer is only formed on the channel of the semiconductor layer.

2. The method according to claim 1, wherein the forming of the channel passivation layer includes forming the channel passivation layer on the active layer by allowing silicon in the active layer to react with one of Ox-plasma and Nx-plasma.

3. The method according to claim 1, further including:
    forming a transparent conductive pattern using the same material as the pixel electrode on the data line connected to the source electrode and along the source electrode and the drain electrode.

4. The method according to claim 3, wherein the forming of the transparent conductive pattern includes:
    depositing a transparent conductive layer on an entire surface of the substrate having the source electrode, the drain electrode, the semiconductor layer, and the channel passivation layer formed thereon; and
    forming a photoresist pattern on the transparent conductive layer.

5. The method according to claim 4, further including, after the forming of the photoresist pattern:
    ashing the photoresist pattern; and
    etching the transparent conductive layer using the ashed photoresist pattern.

6. The method according to claim 1, further including:
    forming a storage capacitor including the gate line connected to the gate electrode and the pixel electrode that overlaps the gate line with the gate insulating layer in between.

7. The method according to claim 1, further including:
    forming a gate pad lower electrode extending from the gate line connected to the gate electrode;
    forming a contact hole passing through the gate insulating layer to expose the gate pad lower electrode; and
    forming a gate pad upper electrode connected to the gate pad lower electrode through the contact hole.

8. The method according to claim 1, further including:
forming a data pad lower electrode connected to the data line connected to the source electrode through the jumping electrode on the semiconductor layer; and
forming a data pad upper electrode connected to the data pad lower electrode through a contact hole with the gate insulating layer in between.

9. The method according to claim 1, wherein the jumping electrode is made of a transparent conductive pattern.

10. The method according to claim 1, wherein the data pad and the data line are formed of different materials.

11. A method of fabricating a TFT (thin film transistor) array substrate comprising:
forming a first conductive pattern group that includes a gate line, a gate electrode connected to the gate line, a gate pad lower electrode extending from the gate line, and a data pad lower electrode on a substrate;
forming a gate insulating layer to cover the first conductive pattern group;
forming a second conductive pattern group that includes a data line that intersects the gate line, a source electrode protruding from the data line, a drain electrode that faces the source electrode with a channel in between and a semiconductor group that forms the channel on the gate insulating layer, and forming a channel passivation layer on the channel of the semiconductor group;
forming a first contact hole passing through the gate insulating layer to expose the gate pad lower electrode and a second contact hole passing through the gate insulating layer to expose a portion of the data pad lower electrode; and
forming a third conductive pattern group that includes a pixel electrode contacting the drain electrode, a data pad upper electrode connected to the data pad lower electrode through the second contact hole, a gate pad upper electrode connected to the gate pad lower electrode through the first contact hole, and a jumping electrode connecting the data pad lower electrode with the data line through a contact hole,
wherein the forming of the second conductive pattern group, includes:
sequentially forming a first semiconductor layer, a second semiconductor layer, and a data metal layer on the gate insulating layer;
forming a step photoresist pattern on the data metal layer using a partial exposure mask;
patterning the first and second semiconductor layers, and the data metal layer using the photoresist pattern to form the semiconductor group including an active layer and an ohmic contact layer, the data line, the source electrode, and the drain electrode;
ashing the photoresist pattern;
patterning the metal layer and the ohmic contact layer that correspond to the channel using the ashed photoresist pattern to expose the active layer forming the channel;
exposing the exposed surface of the active layer to plasma using the ashed photoresist pattern as a mask to form the channel passivation layer on the exposed active layer; and
removing the ashed photoresist pattern, and
wherein the channel passivation layer is only formed on the channel of the semiconductor layer.

12. The method according to claim 11, wherein the forming of the channel passivation layer includes forming the channel passivation layer on the active layer by allowing silicon in the active layer that forms the channel to react to one of Ox-plasma and Nx-plasma.

13. The method according to claim 11, further including:
forming a transparent conductive pattern using the same material as the pixel electrode on the data line, the source electrode, and the drain electrode.

14. The method according to claim 11, further including:
forming a static electricity prevention line pattern connected to the data line and spaced a predetermined interval when the first conductive pattern group is formed.

15. The method according to claim 11, wherein the first conductive pattern group further includes a first shorting bar and the second conductive pattern group further includes a second shorting bar.

16. The method according to claim 15, further including cutting and removing the first and second shorting bars.

* * * * *